United States Patent
Zheng et al.

(10) Patent No.: US 7,489,447 B2
(45) Date of Patent: Feb. 10, 2009

(54) OPTICAL CONDENSER DEVICE

(75) Inventors: Yujin Zheng, Hamamatsu (JP);
Hirofumi Miyajima, Hamamatsu (JP);
Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/523,634

(22) PCT Filed: Aug. 7, 2003

(86) PCT No.: PCT/JP03/10089

§ 371 (c)(1),
(2), (4) Date: Jan. 3, 2006

(87) PCT Pub. No.: WO2004/015478

PCT Pub. Date: Feb. 19, 2004

(65) Prior Publication Data

US 2006/0103939 A1     May 18, 2006

(30) Foreign Application Priority Data

Aug. 7, 2002   (JP) .............................. 2002-230279

(51) Int. Cl.
G02B 27/14   (2006.01)
G02B 27/10   (2006.01)

(52) U.S. Cl. ...................... 359/629; 359/618

(58) Field of Classification Search .................. 359/629
See application file for complete search history.

(56) References Cited

U.S. PATENT DOCUMENTS 5,048,030 A * 9/1991 Hiiro ............................ 372/68
5,212,710 A * 5/1993 Kaneda et al. ................. 372/71

(Continued)

FOREIGN PATENT DOCUMENTS

DE     19751716     5/1998

(Continued)

OTHER PUBLICATIONS

Satoshi Yamaguchi et al., "Collimation of Emissions From A 1-cm Aperture Tightly Arranged, Multistripe Laser-Diode Bar With A Multiprism Array Coupling", Applied Optics, vol. 36, No. 9, Mar. 20, 1997, pp. 1875-1878.

(Continued)

*Primary Examiner*—Jordan M. Schwartz
*Assistant Examiner*—James C Jones
(74) *Attorney, Agent, or Firm*—Drinker Biddle & Reath LLP (57) ABSTRACT

An optical condenser device has light sources (10, 20) and an optical combiner (30). Each light source (10, 20) includes a semiconductor laser array (12, 22), a collimator lens (16, 26) and a beam converter (18, 28). The optical combiner (30) combines the beams from the light sources (10, 20). The spread of the beams in planes perpendicular to the direction of alignment of the active layers (14, 24) is restrained by the refraction of the collimator lenses (16, 26). The transverse sections of the respective beams are rotated by substantially 90° by the beam converters (18, 28). The spread of the beams in the direction of alignment of the active layers is thus restrained and crossing of adjacent beams becomes unlikely to occur.

9 Claims, 12 Drawing Sheets

U.S. PATENT DOCUMENTS

| | | | |
|---|---|---|---|
| 5,513,201 A * | 4/1996 | Yamaguchi et al. | 372/75 |
| 6,680,800 B1 * | 1/2004 | Schreiber et al. | 359/618 |
| 2004/0067016 A1 * | 4/2004 | Anikitchev et al. | 385/34 |
| 2004/0252743 A1 * | 12/2004 | Anikitchev et al. | 372/97 |

FOREIGN PATENT DOCUMENTS

| | | |
|---|---|---|
| DE | 199 39 750 | 3/2001 |
| JP | 7-098402 | 4/1995 |
| JP | 7-287189 | 10/1995 |
| JP | 08-062531 | 3/1996 |
| JP | 09-181376 | 7/1997 |
| JP | 10-510933 | 10/1998 |
| JP | 11-72743 | 3/1999 |
| JP | 3071360 | 5/2000 |
| JP | 2001-083460 | 3/2001 |
| JP | 2001-111147 | 4/2001 |
| JP | 2001-215443 | 8/2001 |
| JP | 2002-009385 | 1/2002 |
| WO | WO 99/46625 | 9/1999 |
| WO | 01-06297 | 1/2001 |
| WO | 02/077698 | 10/2002 |

OTHER PUBLICATIONS

Satoshi Yamaguchi et al., "Collimation Of Emissions From A High-Power Multistripe Laser-Diode Bar With Multiprism Array Coupling And Focusing To A Small Spot", Optics Letters, vol. 20, No. 8, Apr. 15, 1995, pp. 898-900.

* cited by examiner

OPTICAL CONDENSER DEVICE

TECHNICAL FIELD

This invention relates to an optical condenser device that increases the density of beams emitted from a semiconductor laser array.

BACKGROUND ART

Figure 11:
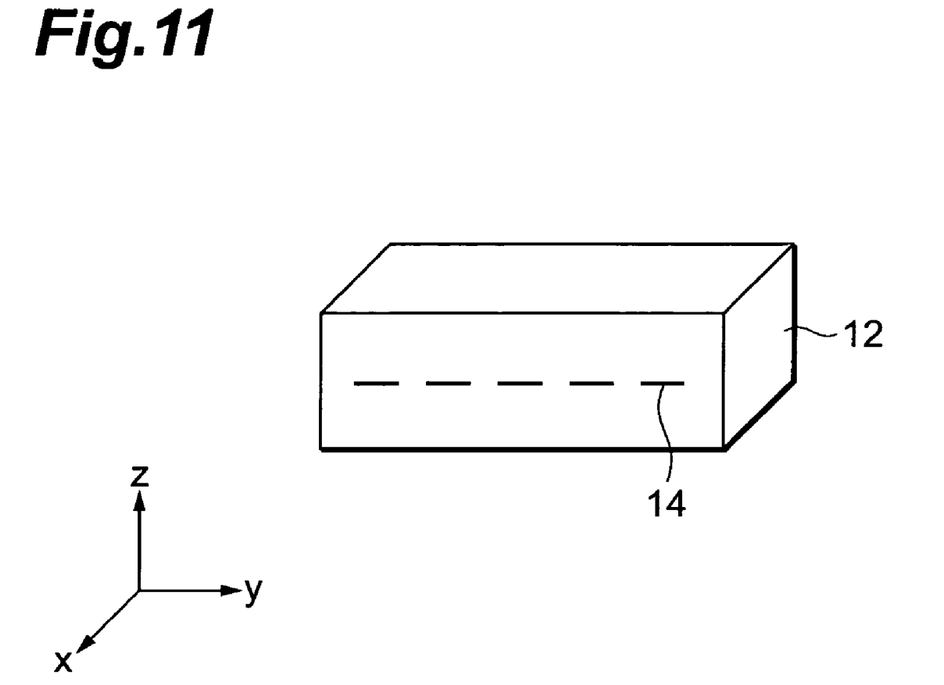
FIG. 11 is a perspective view of a semiconductor laser array.

Semiconductor laser arrays are known as laser elements with high output. FIG. 11 is a perspective view showing an example of a semiconductor laser array. As shown in FIG. 11, in a semiconductor laser array 12, a plurality of active layers 14 are aligned in parallel.

Figure 12A:
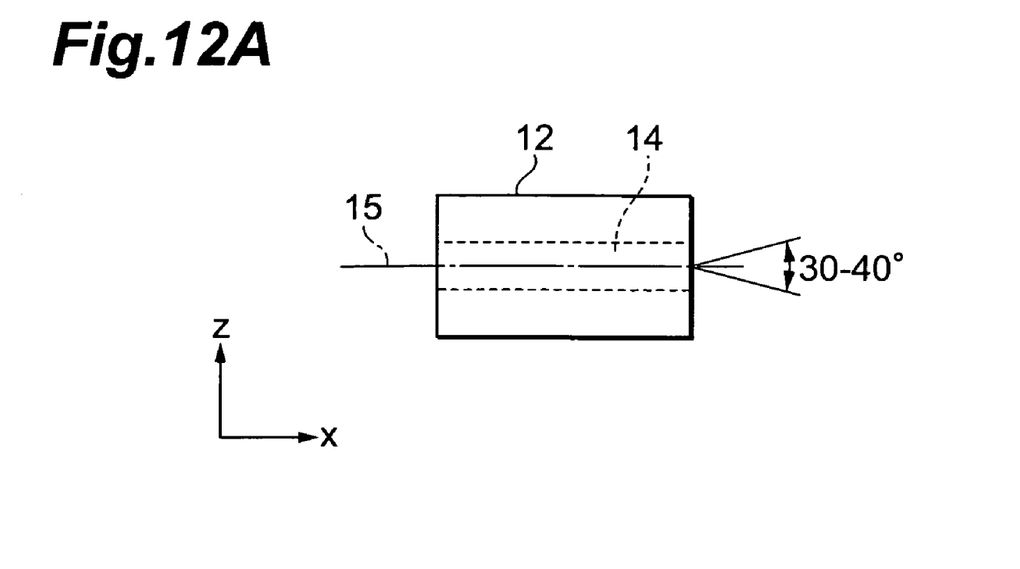
FIG. 12A and FIG. 12B are diagrams illustrating the angles of spread of a beam emitted from the semiconductor laser array.
Figure 12B:
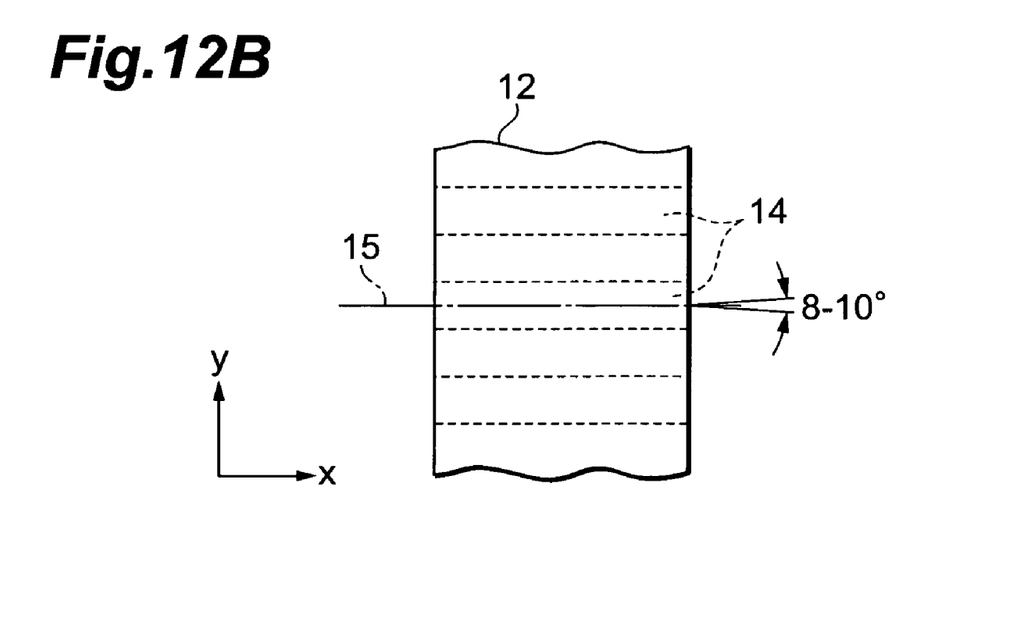

FIG. 12A and FIG. 12B are a side view and a plan view, respectively, of laser array 12 and illustrate the spreading angles of a laser beam emitted from an active layer 14. In these figures, the x-axis, y-axis, and z-axis indicate the longitudinal direction, horizontal direction, and vertical direction, respectively, of laser array 12. Also in these figures, the number 15 indicates the central axis of a beam. For each beam emitted from an active layer 14, the spreading angle in the vertical direction is 30° to 40° (see FIG. 12A) and the spreading angle in the horizontal direction is 8° to 10° (see FIG. 12B).

In consideration of an application wherein lenses, etc., are used to condense beams from a semiconductor laser array onto an optical fiber, etc., it is preferable to restrain the spread of the respective components of the vertical direction and the horizontal direction of each beam. The vertical direction components of the beams can be collimated readily using a collimator lens. On the other hand, it is not easy to restrain the spread of the beams in the horizontal direction. This is because when a plurality of active layers 14 are positioned close to each other, the beams emitted by these active layers 14 cross each other immediately. A method of increasing the interval between the active layers may be considered for preventing the crossing of the beams. However, a high beam density cannot be anticipated in this case.

DISCLOSURE OF THE INVENTION

An optical condenser device in accordance with the present invention comprises a first light source, a second light source, and a first optical combiner. The first light source has a first semiconductor laser array with a plurality of active layers aligned in parallel in a first direction, a first collimator lens for collimating a plurality of beams emitted from the plurality of active layers in a plane perpendicular to the first direction, and a first beam converter for receiving the beams collimated by the first collimator lens to rotate the transverse section of each beam by substantially 90°. The second light source has a second semiconductor laser array with a plurality of active layers aligned in parallel in a second direction, a second collimator lens for collimating a plurality of beams emitted from the plurality of active layers in a plane perpendicular to the second direction, and a second beam converter for receiving the beams collimated by the second collimator lens to rotate the transverse section of each beam by substantially 90°. Here, the transverse section of a beam refers to a cross section that is substantially perpendicular to the axis of that beam. The first optical combiner combines the beams from the first light source and the beams from the second light source. The first optical combiner has one or more transmitting portions for receiving and transmitting the beams emitted from the first beam converter, and one or more reflecting portions for receiving and reflecting the beams emitted from the second beam converter. The first optical combiner combines the beams transmitted through the one or more transmitting portions and the beams reflected by the one or more reflecting portions.

The spread of each beam within a plane perpendicular to the direction of alignment of the active layers is restrained by the collimation of the collimator lens. Rotating the transverse section of each beam by substantially 90° suppresses the spread of the beam in the direction of alignment of the active layers. Accordingly, adjacent beams become unlikely to cross each other. As a result, the active layers can be positioned closely at intervals of no more than 500 μm.

This invention will more fully appear from the following detailed description and the accompanying drawings. It is to be expressly understood, however, that the drawings are for the purpose of illustration only, and are not intended as a definition of the limits of the invention.

Further scope of applicability of this invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BEST MODES FOR CARRYING OUT THE INVENTION

Embodiments of this invention will now be described with reference to the accompanying drawings. In the description of the drawings, the same elements will be provided with the same symbols and redundant descriptions will be omitted.

FIRST EMBODIMENT

Figure 1:
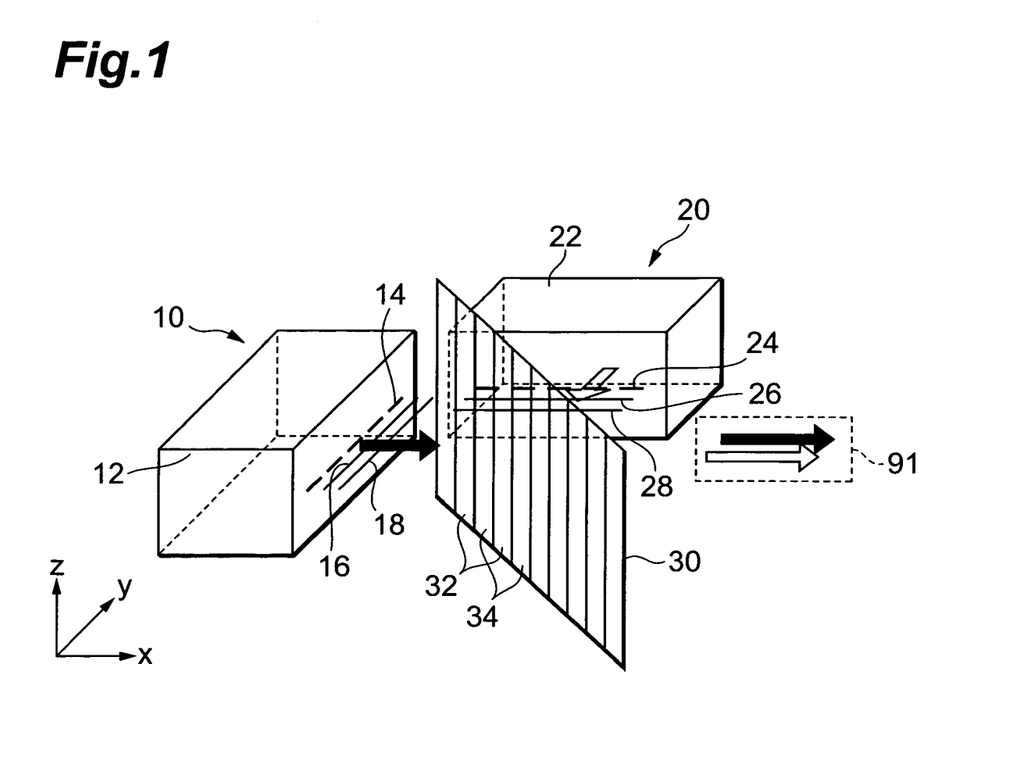
FIG. 1 is a schematic perspective view showing an optical condenser device of a first embodiment.

FIG. 1 is a schematic perspective view showing an optical condenser device in accordance with the first embodiment of the invention. The condenser device of this embodiment is configured of a first light source 10, a second light source 20, and an optical combiner 30.

First light source 10 is configured of a first semiconductor laser array 12, a first collimator lens 16, and a first beam converter 18. Semiconductor laser array 12 has a plurality of active layers 14. Collimator lens 16 refracts and collimates the vertical direction (z-direction) components of the beams emitted from the respective active layers 14. Beam converter 18 rotates the transverse section of each of these collimated beams by substantially 90°.

Figure 2:
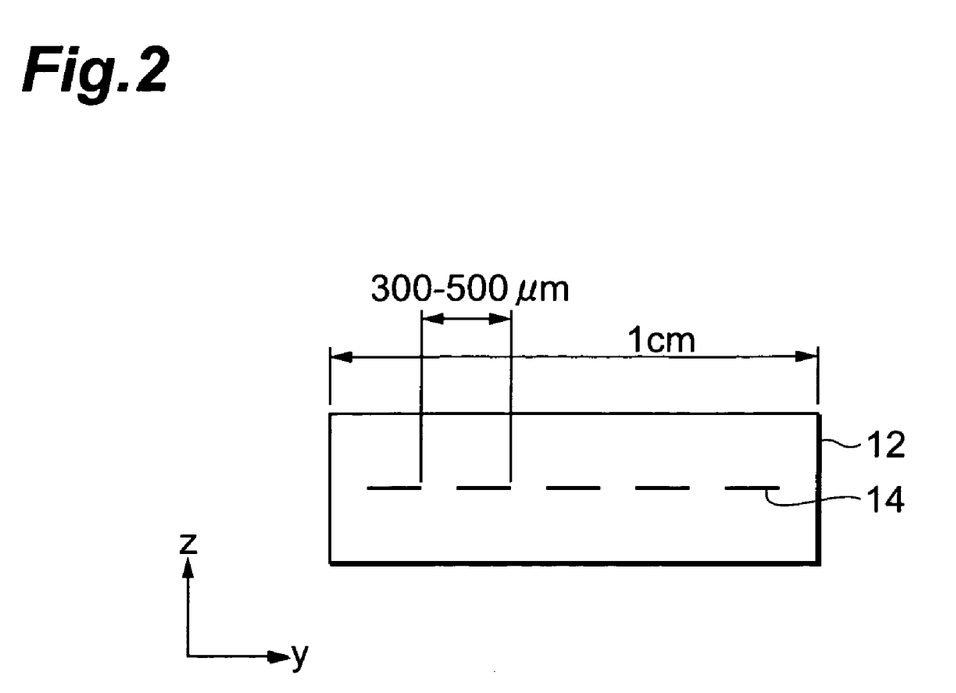
FIG. 2 is a view showing a front end surface (light outputting surface) of a semiconductor laser array used in the first embodiment.
Figure 3:
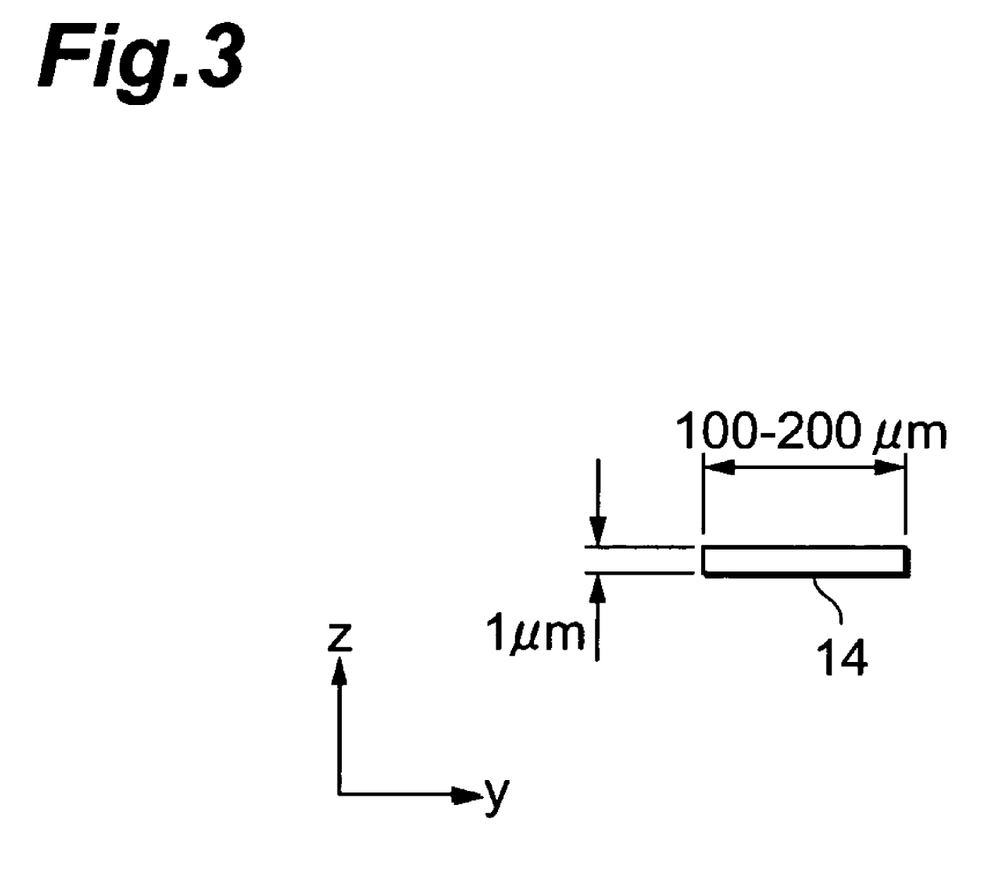
FIG. 3 is a view showing a front end surface of an active layer of the semiconductor laser array used in the first embodiment.

FIG. 2 is a view showing a front end surface (light outputting surface) of first semiconductor laser array 12. FIG. 3 is a view showing a front end surface of active layer 14. Active layers 14 of laser array 12 are aligned, within a width of 1 cm, in a single row along the y-direction at intervals of 300 μm to 500 μm. Though five active layers 14 are drawn in the figures for the sake of simplification of illustration, a larger number of active layers 14 are aligned in reality. The cross section of each active layer 14 has a width of 100 μm to 200 μm and a thickness of 1 μm. As shown in FIG. 12A and FIG. 12B, the angles of spread of the beam emitted from active layer 14 is 30° to 40° in the thickness direction of active layer 14, in other words, in the vertical direction (z-direction) and 8° to 10° in the width direction of active layer 14, in other words, in the horizontal direction (y-direction).

Figure 4:
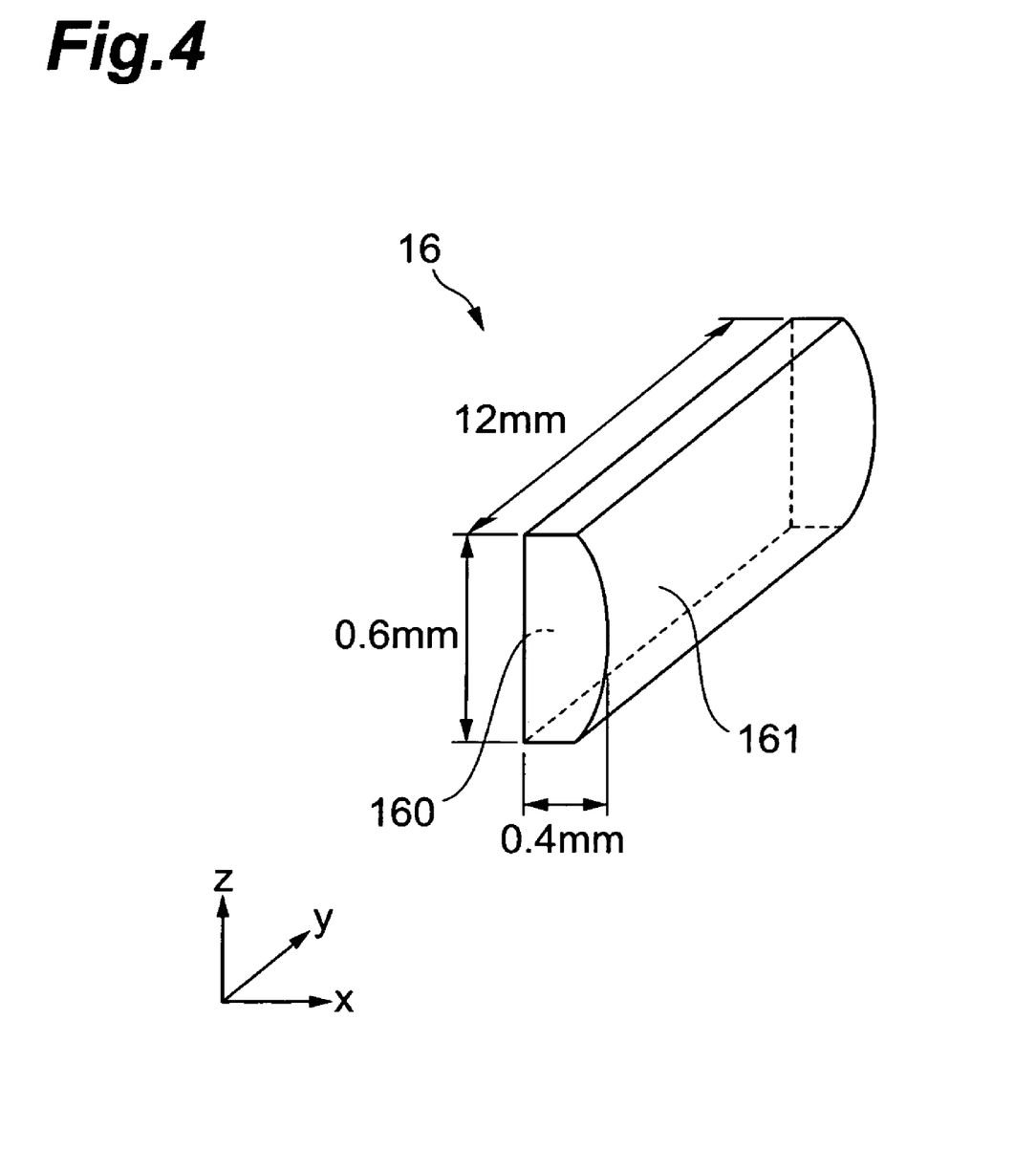
FIG. 4 is a perspective view of a cylindrical lens used in the first embodiment.

FIG. 4 is a perspective view showing a cylindrical lens as an example of first collimator lens 16. Cylindrical lens 16 has an input surface 160 and an output surface 161 that oppose each other. Input surface 160 is a flat surface that is perpendicular to the x-direction and output surface 161 is a cylindrical surface having a generating line along the y-direction. Though cylindrical lens 16 does not provide a refractive action in the plane containing the generating line direction, it provides a refractive action in the plane perpendicular to the generating line. As shown in FIG. 4, the length in the generating line direction, that is, the y-direction is 1.2 mm, the length in the x-direction is 0.4 mm, and the length in the z-direction is 0.6 mm. Thus cylindrical lens 16 is elongated along the y-direction. The length in the y-direction is large enough for input surface 160 to cover all active layers 14 of laser array 12. Thus all the beams emitted from these active layers 14 enter cylindrical lens 16.

Since the beams emitted from active layers 14 are large in the angle of spread in the vertical direction, as mentioned above, the spread of the beams must be restrained in order to improve the condensing efficiency. Cylindrical lens 16 is thus set so that the generating line of its output surface 161 will be orthogonal to the vertical direction (z-direction) of semiconductor laser array 12. The beams emitted from active layers 14 can thereby be collimated in the vertical direction, that is, can be collimated within a plane perpendicular to the generating line of cylindrical lens 16. In order for efficient collimation, cylindrical lens 16 is positioned close to active layers 14.

Figure 5:
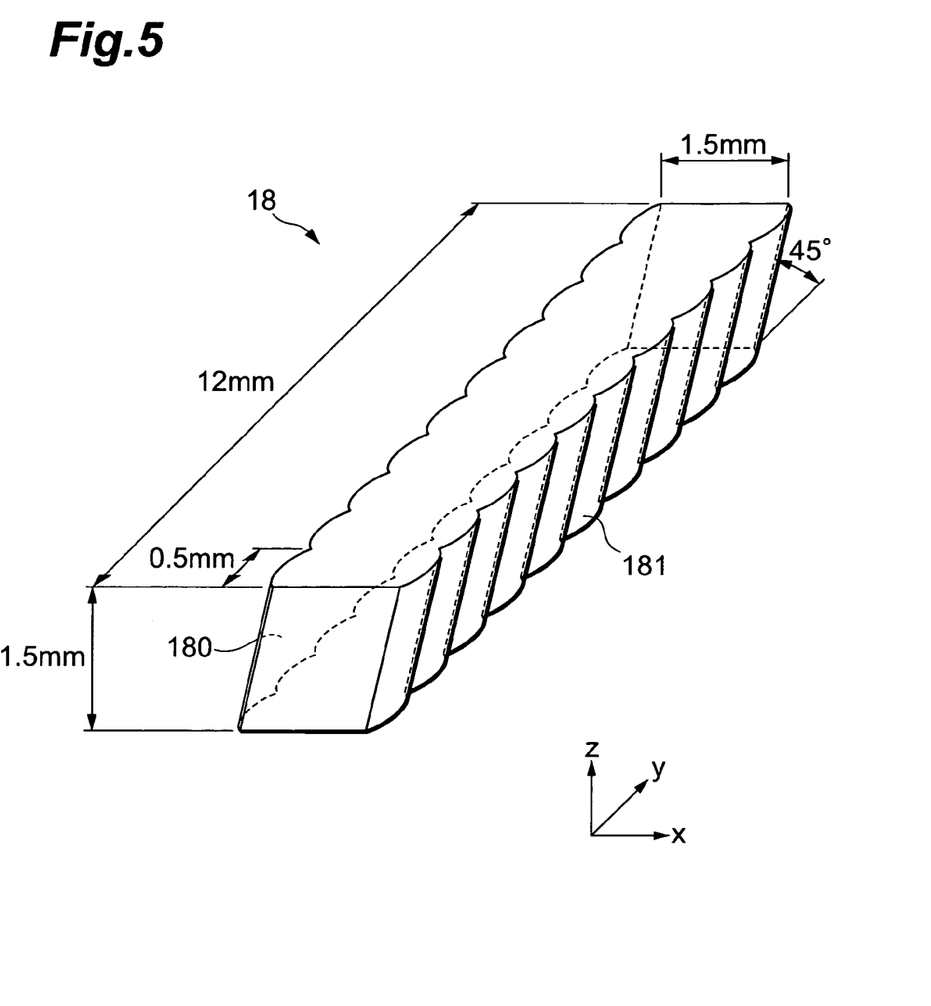
FIG. 5 is a perspective view of a beam converter used in the first embodiment.

FIG. 5 is a perspective view showing an example of first beam converter 18. Beam converter 18 is formed of glass, quartz, or other light transmitting material. The length in the x-direction is 1.5 mm, the length in the y-direction is 12 mm, and the length in the z-direction is 1.5 mm. Beam converter 18 has a shape that is elongated along the y-direction. Thus all the beams emitted from cylindrical lens 16 enter beam converter 18. Beam converter 18 has an input surface 180 and an output surface 181 that oppose each other. Input surface 180 has a plurality of oblique cylindrical surfaces that are aligned in parallel. The width of each oblique cylindrical surface is 0.5 mm. These oblique cylindrical surfaces extend at an angle of 45° with respect to the y-direction. The number of these oblique cylindrical surfaces is equal to the number of active layers 14. These oblique cylindrical surfaces are thus in one-to-one correspondence with active layers 14. Output surface 181 likewise has a plurality of oblique cylindrical surfaces of 0.5 mm width aligned in parallel. These oblique cylindrical surfaces also extend at an angle of 45° with respect to the y-direction and are in one-to-one correspondence with active layers 14.

The beam converter used in this invention is not limited to that shown in FIG. 5. Another example of a beam converter is described, for example, in Japanese Patent Publication No. 3071360.

Second light source 20 has the same configuration as first light source 10. That is, second light source 20 is configured of a second semiconductor laser array 22, a second cylindrical lens 26, and a second beam converter 28. Second semiconductor laser array 22, second cylindrical lens 26, and second beam converter 28 are the same in configuration as first semiconductor laser array 12, first cylindrical lens 16, and first beam converter 18, respectively. Detailed description of these components thus will be omitted.

The orientation of second light source 20 differs from the orientation of first light source 10. More specifically, whereas first laser array 12 has the plurality of active layers 14 aligned in parallel in the y-direction, second laser array 22 has a plurality of active layers 24 aligned in parallel in the x-direction. Second cylindrical lens 26 is positioned along the x-direction in correspondence to active layers 24. Second beam converter 28 is also positioned along the x-direction in correspondence to active layers 24.

Figure 6:
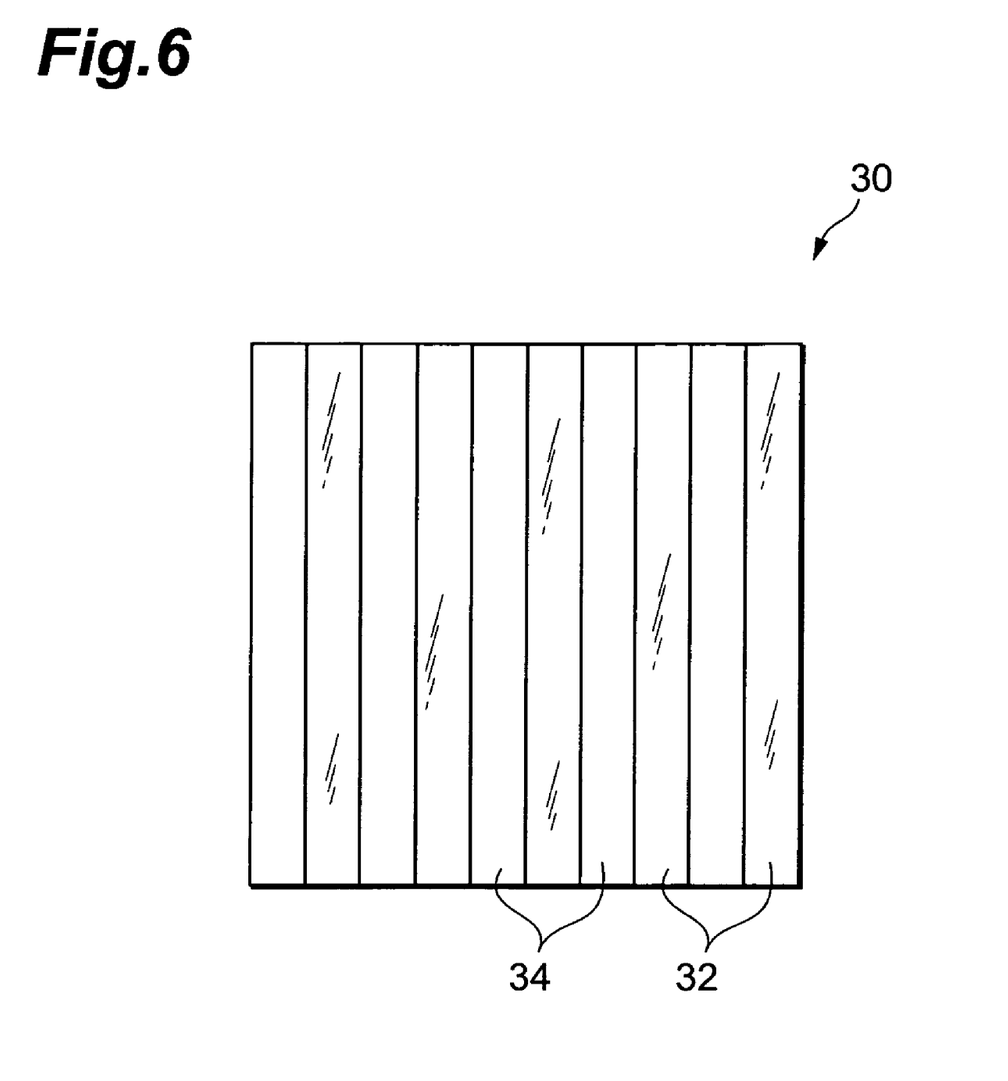
FIG. 6 is a plan view showing an optical combiner used in the first embodiment.

FIG. 6 is a plan view showing optical combiner 30. Optical combiner 30 is configured of a flat plate having a plurality of transmitting portions 32 and a plurality of reflecting portions 34 positioned alternately. Transmitting portions 32 and reflecting portions 34 have a strip-like shape with the same dimension. More specifically, transmitting portions 32 and reflecting portions 34 are respectively formed on a single flat plate formed of a light transmitting member and are positioned alternately in and parallel as narrow, stripe-like shapes extending in the z-direction. Transmitting portions 32 receive the beams emitted from first beam converter 18. A light transmitting thin film is formed on the surface of each transmitting portion 32. Meanwhile, reflecting portions 34 receive the beams emitted from second beam converter 28. A light reflecting thin film is formed on the surface of each reflecting portion 34. Optical combiner 30 is inclined at an angle of 45° with respect to central axes 15 of the beams emitted from active layers 14 of first light source 10. Optical combiner 30 is also inclined at an angle of 45° with respect to central axes 15 of the beams emitted from active layers 24 of second light source 20.

The front surface of optical combiner 30 opposes first light source 10 and the back surface of optical combiner 30 opposes second light source 20. Transmitting portions 32 are in one-to-one correspondence with active layers 14 of first light source 10. Meanwhile, reflecting portions 34 are in one-to-one correspondence with active layers 24 of second light source 20. The beam emitted from first light source 10 is transmitted through the transmitting portion 32 of optical combiner 30. Meanwhile, the beam emitted from second light source 20 is reflected by the reflecting portion 34 of optical combiner 30. As a result, these beams propagate in the same direction at the back surface side of optical combiner 30. As shown in FIG. 1, these beams are mixed into a combined beam 91.

Figure 7A:
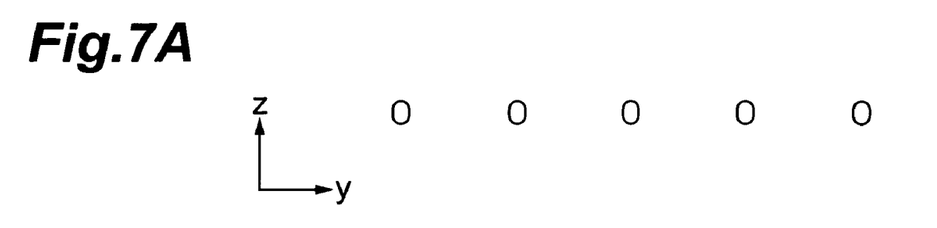
FIG. 7A to FIG. 7C are diagrams illustrating the change of the transverse sections of beams in the first embodiment.
Figure 7B:
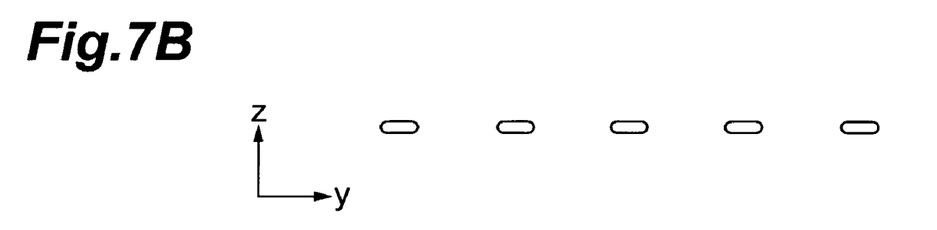
Figure 7C:
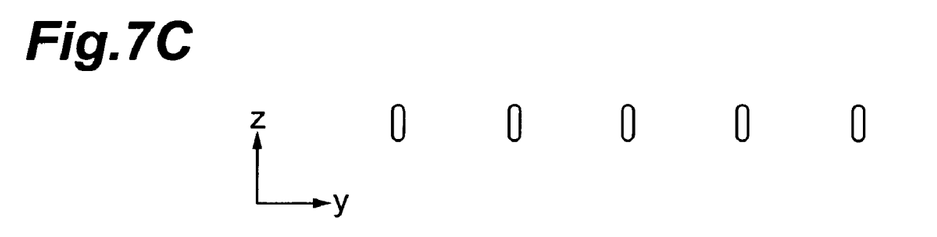
Figure 8A:
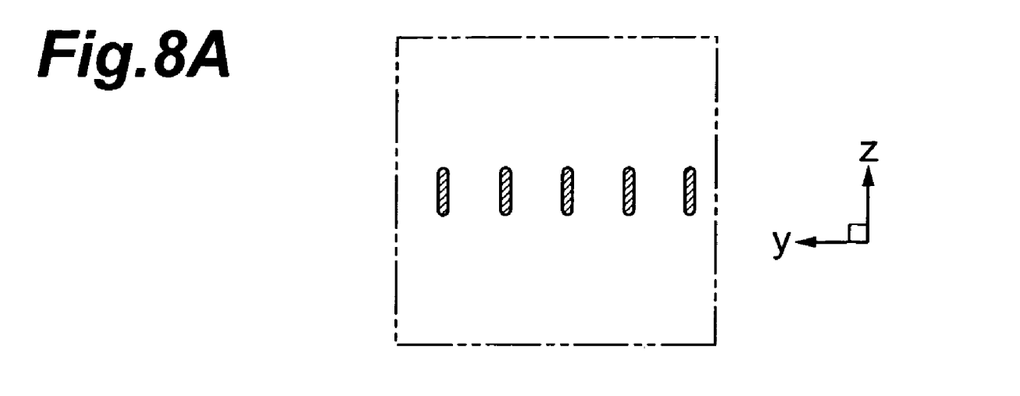
FIG. 8A to FIG. 8C are diagrams illustrating combining of the beams in the first embodiment.
Figure 8B:
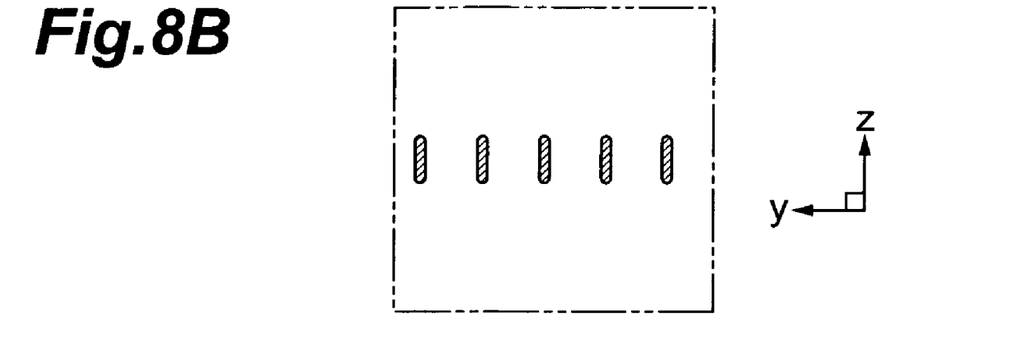
Figure 8C:
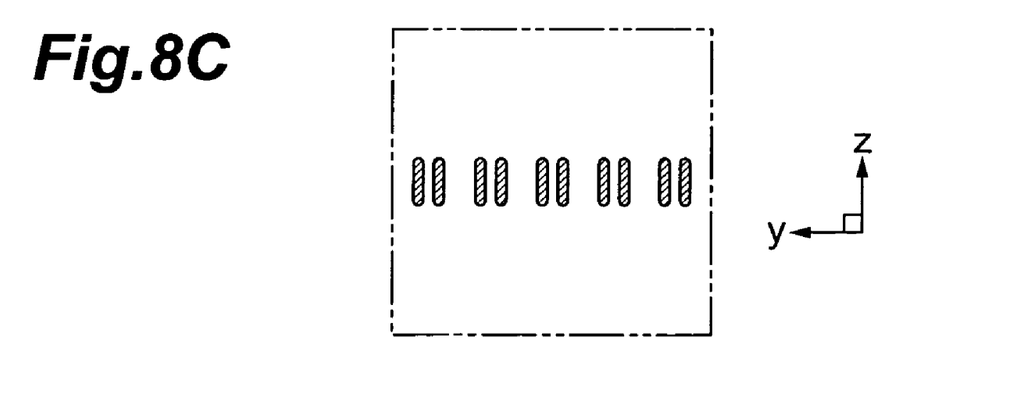

The actions of the condenser device of the present embodiment will now be described with reference to FIG. 7A to FIG. 7C and FIG. 8A to FIG. 8C. Here, FIG. 7A shows the transverse sections of the laser beams generated in active layers 14 or 24 and emitted therefrom, that is, the emission patterns. FIG. 7B shows the transverse sections of the beams emitted from active layers 14 or 24 and then transmitted through cylindrical lens 16 or 26. FIG. 7C shows the transverse sections of the beams transmitted through cylindrical lens 16 or 26 and then transmitted though beam converter 18 or 28. FIG. 8A shows the transverse sections of the beams emitted from first light source 10 and transmitted through optical combiner 30, which transverse sections are taken perpendicularly to their central axes 15. FIG. 8B shows the transverse sections of the beams emitted from second light source 20 and reflected by optical combiner 30, which transverse sections are taken perpendicularly to their central axes 15. FIG. 8C shows the transverse section of combined beam 91 of the beams from first light source 10 and the beams from second light source 20, which transverse section is taken perpendicularly to the central axe of combined beam 91. The chain double-dashed lines in FIG. 8A to FIG. 8C indicate optical combiner 30.

As shown in FIG. 7A, each beam has a cross-sectional shape that is close to a circle on its emission from active layers 14 or 24. When being transmitted through cylindrical lens 16 or 26, each beam is subject to the refraction in a plane perpendicular to the direction of the generating line of cylindrical lens 16 or 26. As a result, the vertical direction components of the beams are collimated as shown in FIG. 7B. Meanwhile, since the horizontal direction components of the beams are not subject to the refraction, the beams do not change in the angle of spread in the horizontal direction.

After the transmission through first cylindrical lens 16, the beams emitted from active layers 14 enter first beam converter 18. As shown in FIG. 7C, beam converter 18 rotates the transverse sections of these beams by substantially 90° about central axes 15 of the respective beams. The beams collimated in the vertical direction are thereby converted into beams that are collimated in the horizontal direction. As a result, the beams no longer diverge in the horizontal direction. The crossing of adjacent beams can thus be avoided.

As with the beams from the first light source, the vertical direction components of the beams emitted from active layers 24 of second light source 20 are collimated upon transmission through second cylindrical lens 26. Upon transmission through second beam converter 28, these beams are converted into beams that are collimated in the horizontal direction. As a result, in also second light source 20, the beams do not diverge in the horizontal direction, and the crossing of adjacent beams can thus be avoided.

The beams emitted from first beam converter 18 are transmitted through transmitting portions 32 of optical combiner 30. As shown in FIG. 8A, the beams emitted from the respective active layers 14 are transmitted through the corresponding transmitting portions 32 without crossing each other. Meanwhile, the beams emitted from second beam converter 28 are reflected by reflecting portions 34 of optical combiner 30. As shown in FIG. 8B, the beams emitted from the respective active layers 24 are reflected by the corresponding reflecting portions 34 without crossing each other.

The beams transmitted through the transmitting portions 32 and the beams reflected by reflecting portions 34 form a combined beam 91. As shown in FIG. 8C, the optical density of combined beam 91 equals to the sum of the optical density of the beams emitted from first light source 10 and the optical density of the beams emitted from second light source 20. As a result, the optical density is increased.

The advantages of the condenser device of the present embodiment will now be described. Since the beams emitted from the beam converter do not diverge in the horizontal direction (y-direction), adjacent beams will not cross each other even if the plurality of active layers of the semiconductor laser array are positioned close to each other. This enables close arrangement of the active layers, and therefore higher optical density can be obtained.

SECOND EMBODIMENT

Figure 9:
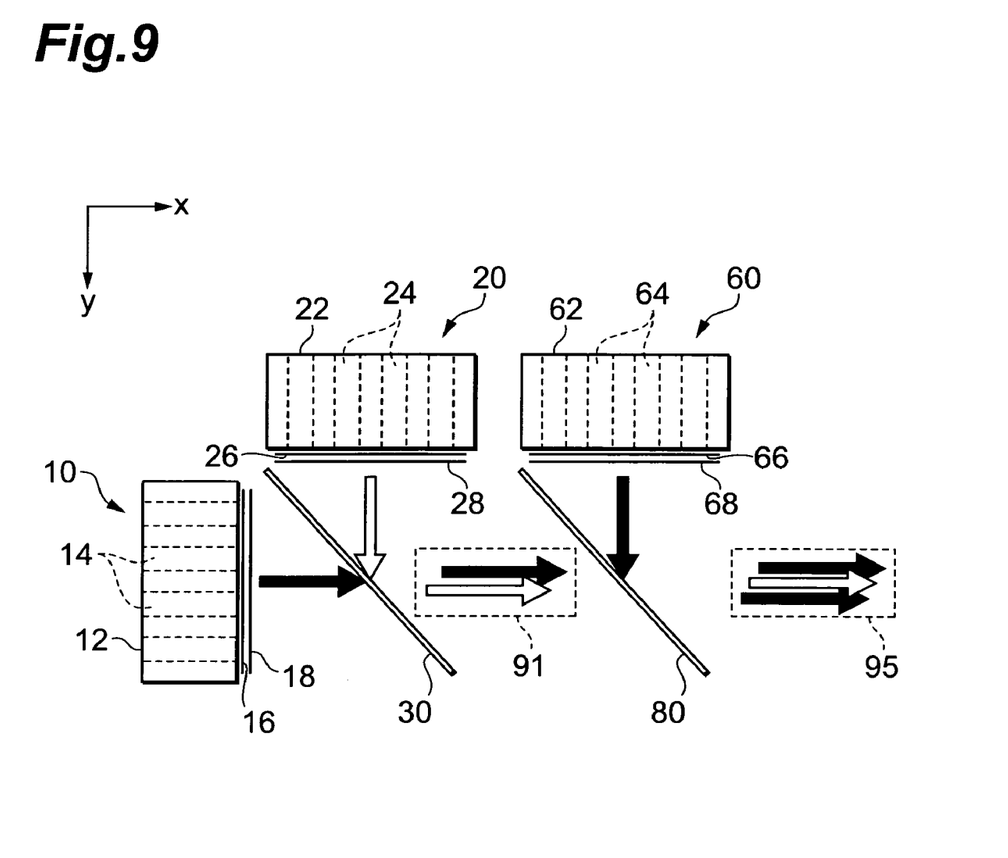
FIG. 9 is a schematic perspective view showing an optical condenser device of a second embodiment.

A second embodiment of the invention will now be described. FIG. 9 is a schematic perspective view showing an optical condenser device of the present embodiment. Whereas the first embodiment is configured of two light sources and a single optical combiner, the present embodiment is configured of three light sources and two optical combiners. Whereas the beams emitted from the two light sources are combined in the first embodiment, the beams emitted from the three light sources are combined in the present embodiment.

The condenser device of the present embodiment is configured of a first light source 10, a second light source 20, a third light source 60, a first optical combiner 30, and a second optical combiner 80. The arrangements and positioning of first light source 10, second light source 20, and first optical combiner 30 have been already described in relation to the first embodiment.

Third light source 60 is configured of a third semiconductor laser array 62, a third collimator lens 66, and a third beam converter 68. Third semiconductor laser array 62 has a plurality of active layers 64. Third collimator lens 66 collimates the vertical direction components of the beams emitted from the respective active layers 64. Third beam converter 68 rotates the transverse sections of these collimated beams by substantially 90°. The configurations of third semiconductor laser array 62, third collimator lens 66, and third beam converter 68 are the same as those of semiconductor laser arrays 12 and 22, collimator lenses 16 and 26, and beam converters 18 and 28, respectively.

The orientation of third light source 60 is the same as the orientation of second light source 20 and differs from that of first light source 10. Whereas first semiconductor laser array 12 has a plurality of active layers 14 aligned in parallel in the y-direction, second and third semiconductor laser arrays 22 and 62 have pluralities of active layers 24 and 64 aligned in parallel in the x-direction. Third cylindrical lens 66 is positioned along the x-direction in correspondence to active layers 64. Likewise, third beam converter 68 is also positioned along the x-direction.

As is described with the first embodiment, the beam emitted from first light source 10 is transmitted through the transmitting portion of first optical combiner 30. Meanwhile, the beam emitted from second light source 20 is reflected by the reflecting portion of first optical combiner 30. As a result, these beams propagate in the same direction at the back surface side of first combiner 30. As shown in FIG. 9, these beams are mixed into a combined beam 91.

Second optical combiner 80 has the same configuration as that of first optical combiner 30. That is, second optical combiner 80 is configured of a flat plate having a plurality of transmitting portions and a plurality of reflecting portions positioned alternately. The transmitting portions and the reflecting portions have a strip-like shape with the same dimension. More specifically, the transmitting portions and reflecting portions are respectively formed on a single flat plate formed of a light transmitting member and are positioned alternately and in parallel as long, narrow stripe-like shapes extending in the z-direction. The transmitting portions of second optical combiner 80 receive combined beam 91 emitted from first optical combiner 30. Meanwhile, the reflecting portions of second optical combiner 80 receive beams emitted from third beam converter 68. Second optical combiner 80 is inclined at an angle of 45° with respect to the central axis of combined beam 91. Second optical combiner 80 is also inclined at an angle of 45° with respect to the central axes of the beams emitted from active layers 64 of third light source 60. The front surface of optical combiner 80 opposes first optical combiner 30 and the back surface of second optical combiner 80 opposes third light source 60. The reflecting portions of second optical combiner 80 are in one-to-one correspondence with active layers 64 of third light source 60.

The combined beam 91 is transmitted through the transmitting portions of second optical combiner 80. Meanwhile, the beam emitted from third light source 60 is reflected by the reflecting portion of second optical combiner 80. As a result, these beams propagate in the same direction at the back surface side of second optical combiner 80. These beams are mixed into a combined beam 95.

Figure 10A:
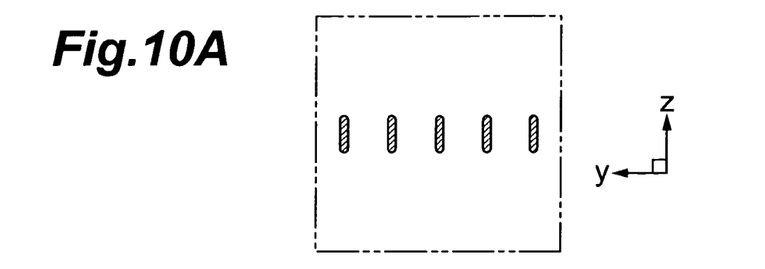
FIG. 10A to FIG. 10E are diagrams illustrating combining of beams in the second embodiment.
Figure 10B:
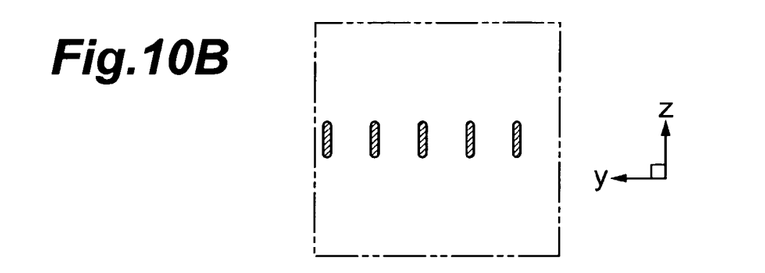
Figure 10C:
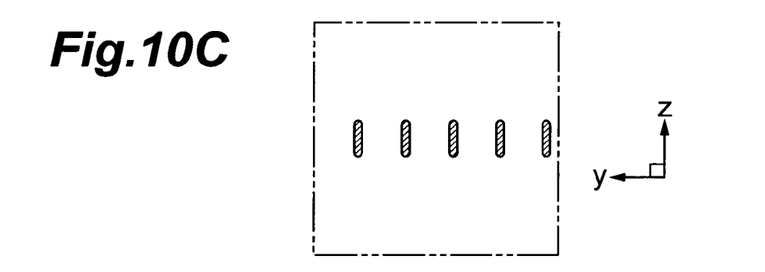
Figure 10D:
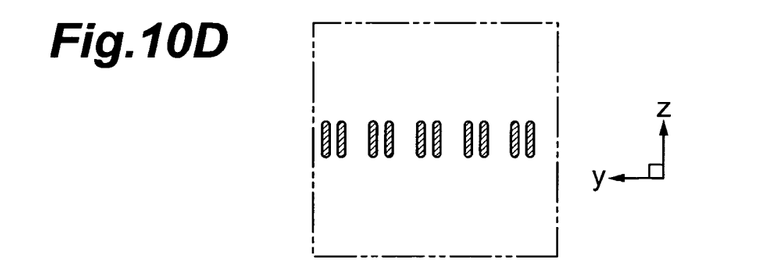
Figure 10E:
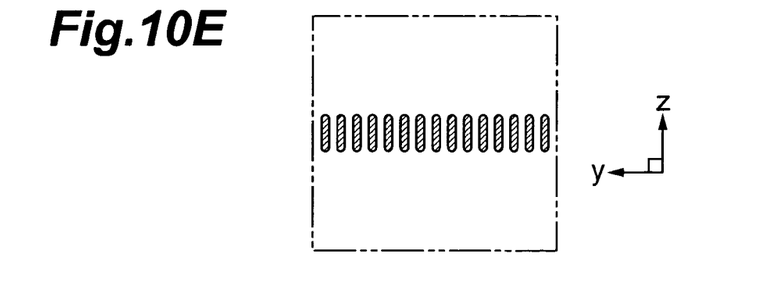

The actions of the condenser device of the present embodiment will now be described with reference to FIG. 10A to FIG. 10E. FIG. 10A shows the transverse sections of the beams emitted from first light source 10 and transmitted through optical combiner 30, which transverse sections are taken perpendicularly to their central axes 15. FIG. 10B shows the transverse sections of the beams emitted from second light source 20 and reflected by optical combiner 30, which transverse sections are taken perpendicularly to their central axes 15. FIG. 10C shows the transverse sections of the beams emitted from third light source 60 and reflected by optical combiner 80, which transverse sections are taken perpendicularly to their central axes 15. FIG. 10D shows the transverse section of combined beam 91 of the beams from first light source 10 and the beams from second light source 20, which transverse section is taken perpendicularly to the central axis of combined beam 91. FIG. 10E shows the transverse section of combined beam 95 of combined beam 91 and the beams emitted from third light source 60, which transverse section is taken perpendicularly to the central axis of combined beam 95. The chain double-dashed lines in FIG. 10A to FIG. 10E indicate optical combiner 30 or 80.

As shown in FIG. 7A, each beam has a cross-sectional shape that is close to a circle on its emission from active layers 14, 24 or 64. When being transmitted through the corresponding cylindrical lens 16, 26 or 66, each beam is subject to the refraction in a plane perpendicular to the direction of the generating line of cylindrical lens 16, 26 or 66. As a result, the vertical direction components of the beams are collimated as shown in FIG. 7B. Meanwhile, since the horizontal direction components of the beams are not subject to the refraction, the beams do not change in the angle of spread in the horizontal direction.

After the transmission through cylindrical lenses 16, 26 and 66, the beams enter beam converters 18, 28 and 68. As shown in FIG. 7C, beam converters 18, 28 and 68 rotate the transverse sections of these beams by substantially 90° about central axes of the respective beams. The beams collimated in the vertical direction are thereby converted into beams that are collimated in the horizontal direction. As a result, the beams no longer diverge in the horizontal direction. The crossing of adjacent beams can thus be avoided.

The beams emitted from beam converter 18 of first light source 10 are transmitted through transmitting portions 32 of first optical combiner 30. As shown in FIG. 10A, the beams emitted from the respective active layers 14 are transmitted through the corresponding transmitting portions 32 without crossing each other. Meanwhile, the beams emitted from beam converter 28 of second light source 20 are reflected by reflecting portions 34 of first optical combiner 30. As shown in FIG. 10B, the beams emitted from the respective active layers 24 are reflected by the corresponding reflecting portions 34 without crossing each other.

The beams transmitted through transmitting portions 32 and the beams reflected by reflecting portion 34*s* form a combined beam 91. As shown in FIG. 10D, the optical density of the combined beam equals to the sum of the density of the beams emitted from first light source 10 and the density of the beams emitted from second light source 20.

Combined beam 91 formed by first optical combiner 30 is transmitted through the transmitting portions of second optical combiner 80. Meanwhile, the beams emitted from beam converter 68 of third light source 60 are reflected by the reflecting portions of second optical combiner 80. As shown in FIG. 10C, the beams emitted from the respective active layers 64 are reflected by the corresponding reflecting portions without crossing each other.

Combined beam 91 transmitted through the transmitting portions of optical combiner 80 and the beams reflected by the reflecting portions of optical combiner 80 form a combined beam 95. As shown in the FIG. 10E, the optical density of combined beam 95 equals to the sum of the density of the beams emitted from first light source 10, the density of the beams emitted from second light source 20 and the density of the beams emitted from third light source 60. The optical density is thus made very high.

The advantages of the condenser device of the present embodiment will now be described. Since the beams emitted from the beam converter do not diverge in the horizontal direction (y-direction), adjacent beams will not cross each other even if the plurality of active layers of the semiconductor laser array are positioned closed to each other. This enables combining the beams from the three light sources as well as close positioning of the active layers, and therefore much higher density can be obtained.

The invention has been explained in detail hereinabove based on the embodiments thereof. However, the invention is not limited to the embodiments, and various modifications are possible without departing from the scope of the invention.

In the embodiments described above, a cylindrical lens is cited as an example of a collimator lens; however, a glass fiber lens or a SELFOC lens, etc., maybe used instead. Also, this invention maybe an optical condenser device using four or more light sources.

In the second embodiment, combined beam 91 is transmitted through second optical combiner 80 and the beams emitted from third light source 60 are reflected by second optical combiner 80 to form combined beam 95. Alternatively, combined beam 95 may be formed by causing the beams emitted from third light source 60 to be transmitted through second optical combiner 80 and causing combined beam 91 to be reflected by second optical combiner 80. In this case, the transmitting portions of second optical combiner 80 receive the beams emitted from third beam converter 68. Also, the reflecting portions of second optical combiner 80 receive combined beam 91. The transmitting portions of second optical combiner 80 are put in one-to-one correspondence with active layers 64 of semiconductor laser array 62.

INDUSTRIAL APPLICABILITY

The optical condenser device in accordance with the invention uses a collimator lens to collimate beams emitted from a semiconductor laser array, and then rotates the transverse sections of the beams by substantially 90° using a beam converter. The spread of the beams in the direction in which the active layers are aligned can thereby be restrained and the crossing of adjacent beams can be avoided. Since the active layers can thus be positioned closely, a high optical density can be obtained. The condenser device of this invention can thus be applied favorably to solid laser pumping, printing, material processing, and medical applications that require high optical density.

The invention claimed is:

1. An optical condenser device comprising:
    a first light source having a first semiconductor laser array with a plurality of active layers aligned in parallel in a first direction, a first collimator lens for collimating a plurality of beams emitted from the plurality of active layers in a plane perpendicular to the first direction, and a first beam converter for receiving the beams collimated by the first collimator lens to rotate the transverse section of each beam by substantially 90°;
    a second light source having a second semiconductor laser array with a plurality of active layers aligned in parallel in a second direction, a second collimator lens for collimating a plurality of beams emitted from the plurality of active layers in a plane perpendicular to the second direction, and a second beam converter for receiving the beams collimated by the second collimator lens to rotate the transverse section of each beam by substantially 90°; and
    a first optical combiner for combining the beams from the first light source with the beams from the second light source, the first optical combiner having one or more transmitting portions for receiving and transmitting the beams emitted from the first beam converter and one or more reflecting portions for receiving and reflecting the beams emitted from the second beam converter to combine the beams transmitted through the one or more transmitting portions with the beams reflected by the one or more reflecting portions,
    wherein the first optical combiner has a plurality of the transmitting portions which are in one-to-one correspondence with the active layers of the first light source, and a plurality of the reflecting portions which are in one-to-one correspondence with the active layers of the second light source,
    wherein the plurality of transmitting portions and the plurality of reflecting portions are both strip-like in form, and
    wherein the first optical combiner is a flat plate having the plurality of transmitting portions and the plurality of reflecting portions positioned alternately.

2. The optical condenser device according to claim 1, wherein the plurality of active layers are aligned at intervals of no more than 500 µm.

3. The optical condenser device according to claim 1, wherein the first optical combiner is inclined at an angle of 45° with respect to the central axes of both the beams emitted from the active layers of the first light source and the beams emitted from the active layers of the second light source, wherein the front surface of the first optical combiner opposes the first light source, and
    wherein the back side of the first optical combiner opposes the second light source.

4. The optical condenser device according to claim 1, further comprising:
    a third light source having a third semiconductor laser array with a plurality of active layers aligned in parallel in a third direction, a third collimator lens collimating a plurality of beams emitted from the plurality of active layers in a plane perpendicular to the third direction, and a third beam converter for receiving the beams collimated by the third collimator lens and rotating the transverse section of each beam by substantially 90°; and
    a second optical combiner having one or more transmitting portions for receiving and transmitting the beams combined by the first optical combiner and one or more reflecting portions for receiving and reflecting the beams emitted from the third beam converter to combine the beams transmitted through the one or more transmitting portions and the beams reflected by the one or more reflecting portions.

5. The optical condenser device according to claim 4, wherein the second optical combiner has a plurality of the reflecting portions which are in one-to-one correspondence with the active layers of the third light source,
    wherein the one or more transmitting portions and the plurality of reflecting portions are both strip-like in form, and
    wherein the second optical combiner is a flat plate having the one or more transmitting portions and the plurality of reflecting portions positioned alternately.

6. The optical condenser device according to claim 1, further comprising:
    a third light source having a third semiconductor laser array with a plurality of active layers aligned in parallel in a third direction, a third collimator lens collimating a plurality of beams emitted from the plurality of active layers in a plane perpendicular to the third direction, and a third beam converter receiving the beams collimated by the third collimator lens and rotating the transverse section of each beam by substantially 90°; and
    a second optical combiner having one or more transmitting portions for receiving and transmitting the beams emitted from the third beam converter and one or more reflecting portions for receiving and reflecting the beams combined by the first optical combiner to combine the beams transmitted through the one or more transmitting portions and the beams reflected by the one or more reflecting portions.

7. The optical condenser device according to claim 6, wherein the second optical combiner has a plurality of the transmitting portions which are in one-to-one correspondence with the active layers of the third light source,
    wherein the plurality of transmitting portions and the one or more reflecting portions are both strip-like in form, and
    wherein the second optical combiner is a flat plate having the plurality of transmitting portions and the one or more reflecting portions positioned alternately.

8. The optical condenser device according to claim 7, wherein the second optical combiner is inclined at an angle of 45° with respect to the central axes of both the beams combined by the first optical combiner and the beams emitted from the active layers of the third light source,
    wherein the front surface of the second optical combiner opposes the first optical combiner, and wherein the back surface of the second optical combiner opposes the third light source.

9. The optical condenser device according to claim 5, wherein the second optical combiner is inclined at an angle of 45° with respect to the central axes of both the beams combined by the first optical combiner and the beams emitted from the active layers of the third light source, wherein the front surface of the second optical combiner opposes the first optical combiner, and wherein the back surface of the second optical combiner opposes the third light source.

* * * * *